US009543503B2

(12) United States Patent
Meade et al.

(10) Patent No.: US 9,543,503 B2
(45) Date of Patent: *Jan. 10, 2017

(54) MAGNETIC MEMORY CELLS AND METHODS OF FABRICATION

(71) Applicant: Micron Technology, Inc., Boise, ID (US)

(72) Inventors: Roy E. Meade, Boise, ID (US); Sumeet C. Pandey, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/045,865

(22) Filed: Feb. 17, 2016

(65) Prior Publication Data
US 2016/0163963 A1 Jun. 9, 2016

Related U.S. Application Data

(63) Continuation of application No. 14/256,655, filed on Apr. 18, 2014, now Pat. No. 9,269,888.

(51) Int. Cl.
*H01L 29/82* (2006.01)
*H01L 43/02* (2006.01)
(Continued)

(52) U.S. Cl.
CPC ............. *H01L 43/02* (2013.01); *H01L 27/222* (2013.01); *H01L 43/08* (2013.01); *H01L 43/10* (2013.01); *H01L 43/12* (2013.01)

(58) Field of Classification Search
USPC .......................... 257/295, E43.001–E43.007,
257/E27.005–E27.006, E27.008, E29.164,
257/E29.167, E29.272, E29.323, E21.436,
257/E21.663–E21.665, 421, E43.004,
257/422; 438/3, 785, E21.208; 360/313,
360/324, 123.24, 12.45, 316, 319, 326;
428/811.2, 827, 811.1, 800, 828.1, 829,
428/831, 831.2, 457, 826, 828, 832,
428/832.1, 836, 662, 675, 811, 811.3,
428/812, 813, 815, 830, 832.3, 833.1,
428/833.2, 846.2
See application file for complete search history.

(56) References Cited

U.S. PATENT DOCUMENTS 4,882,936 A 11/1989 Garshelis
5,604,030 A 2/1997 Yamane et al.
(Continued)

FOREIGN PATENT DOCUMENTS

CN 102246327 A 11/2011
EP 1353443 A2 10/2003
(Continued)

OTHER PUBLICATIONS

Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.
(Continued)

*Primary Examiner* — Tram H Nguyen
(74) *Attorney, Agent, or Firm* — TraskBritt

(57) ABSTRACT

A magnetic cell includes a magnetic tunnel junction that comprises magnetic and nonmagnetic materials exhibiting hexagonal crystal structures. The hexagonal crystal structure is enabled by a seed material, proximate to the magnetic tunnel junction, that exhibits a hexagonal crystal structure matching the hexagonal crystal structure of the adjoining magnetic material of the magnetic tunnel junction. In some embodiments, the seed material is formed adjacent to an amorphous foundation material that enables the seed material to be formed at the hexagonal crystal structure. In some (Continued)

embodiments, the magnetic cell includes hexagonal cobalt (h-Co) free and fixed regions and a hexagonal boron nitride (h-BN) tunnel barrier region with a hexagonal zinc (h-Zn) seed region adjacent the h-Co. The structure of the magnetic cell enables high tunnel magnetoresistance, high magnetic anisotropy strength, and low damping. Methods of fabrication and semiconductor devices are also disclosed.

20 Claims, 7 Drawing Sheets

(51) Int. Cl.
*H01L 43/10* (2006.01)
*H01L 43/12* (2006.01)
*H01L 27/22* (2006.01)
*H01L 43/08* (2006.01)

(56) References Cited

U.S. PATENT DOCUMENTS

| | | |
|---|---|---|
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,611,405 B1 | 8/2003 | Inomata et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 * | 2/2012 | Ranjan .................. G11C 11/15 365/148 |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 | 8/2013 | Komagaki et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 * | 7/2014 | Han ............................ 257/295 |
| 8,779,538 B2 | 7/2014 | Chen et al. |
| 8,790,798 B2 | 7/2014 | Shukh |
| 8,803,265 B2 | 8/2014 | Lim et al. |
| 8,823,118 B2 | 9/2014 | Horng et al. |
| 8,923,038 B2 | 12/2014 | Kula et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 * | 1/2005 | Kim .................. G11B 5/7325 428/831.2 |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2006/0038213 A1 | 2/2006 | Mori et al. |
| 2006/0042930 A1 | 3/2006 | Mauri |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026263 A1 | 2/2007 | Kubota et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0179699 A1 | 7/2008 | Horng et al. |
| 2008/0182131 A1 * | 7/2008 | Iwasaki .................. G11B 5/732 428/800 |
| 2008/0205130 A1 | 8/2008 | Sun et al. |
| 2008/0225581 A1 | 9/2008 | Yamane et al. |
| 2008/0242088 A1 | 10/2008 | Suzuki |

(56) References Cited

U.S. PATENT DOCUMENTS

| | | |
|---|---|---|
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0180215 A1 | 7/2009 | Ishikawa et al. |
| 2009/0190262 A1 | 7/2009 | Murakami et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1* | 10/2009 | Takenaga ............ G11C 11/16 257/421 |
| 2009/0251829 A1* | 10/2009 | Zhang ............ B82Y 10/00 360/319 |
| 2009/0257151 A1 | 10/2009 | Zhang et al. |
| 2010/0034014 A1 | 2/2010 | Ohno et al. |
| 2010/0080036 A1 | 4/2010 | Liu et al. |
| 2010/0080048 A1 | 4/2010 | Liu et al. |
| 2010/0086809 A1* | 4/2010 | Kuboki ............ G11B 5/732 428/846.7 |
| 2010/0096716 A1* | 4/2010 | Ranjan ............ B82Y 10/00 257/421 |
| 2010/0102406 A1 | 4/2010 | Xi et al. |
| 2010/0109110 A1 | 5/2010 | Wang et al. |
| 2010/0109111 A1* | 5/2010 | Shin ............ B82Y 25/00 257/421 |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1* | 3/2011 | Oh ............ B82Y 25/00 257/421 |
| 2011/0064969 A1 | 3/2011 | Chen et al. |
| 2011/0086439 A1* | 4/2011 | Choi ............ B82Y 25/00 438/3 |
| 2011/0096443 A1 | 4/2011 | Zhang et al. |
| 2011/0121366 A1 | 5/2011 | Or-Bach et al. |
| 2011/0134563 A1 | 6/2011 | Komagaki et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1* | 6/2011 | Takahashi ............ G11B 5/732 428/831.2 |
| 2011/0170339 A1 | 7/2011 | Wunderlich et al. |
| 2011/0170341 A1 | 7/2011 | Butler |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1* | 12/2011 | Lu ............ G01R 33/098 324/252 |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1* | 1/2012 | Lim ............ H01L 43/08 257/421 |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1* | 3/2012 | Daibou ............ H01L 43/10 257/2 |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0221459 A1 | 8/2013 | Jan et al. |
| 2013/0228884 A1 | 9/2013 | Zheng et al. |
| 2013/0229866 A1 | 9/2013 | Ranjan et al. |
| 2013/0242435 A1* | 9/2013 | Fuji ............ G01R 33/093 360/244 |
| 2013/0250661 A1 | 9/2013 | Sandhu et al. |
| 2013/0288392 A1 | 10/2013 | Nozieres et al. |
| 2013/0313665 A1 | 11/2013 | Rhie et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0027869 A1 | 1/2014 | Lee et al. |
| 2014/0038312 A1 | 2/2014 | Lee et al. |
| 2014/0070341 A1* | 3/2014 | Beach ............ H01L 29/82 257/421 |
| 2014/0084398 A1 | 3/2014 | Oguz et al. |
| 2014/0099735 A1 | 4/2014 | Horng et al. |
| 2014/0116984 A1* | 5/2014 | Ding ............ G11B 5/3163 216/22 |
| 2014/0151843 A1 | 6/2014 | Millward et al. |
| 2014/0217526 A1 | 8/2014 | Guo |
| 2014/0264663 A1 | 9/2014 | Chen et al. |
| 2014/0269064 A1 | 9/2014 | Jeon et al. |
| 2014/0287537 A1 | 9/2014 | Shukh |
| 2014/0327095 A1* | 11/2014 | Kim ............ H01L 43/08 257/421 |
| 2014/0339504 A1 | 11/2014 | Kim et al. |
| 2015/0028439 A1 | 1/2015 | Kula et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0249202 A1 | 9/2015 | Siddik et al. |
| 2015/0270478 A1* | 9/2015 | Annunziata ............ H01L 43/08 257/421 |

(56) References Cited

U.S. PATENT DOCUMENTS

| | | | | |
|---|---|---|---|---|
| 2015/0287910 | A1* | 10/2015 | Lu | H01L 43/02 257/421 |
| 2015/0295164 | A1 | 10/2015 | Sandhu et al. | |
| 2015/0303372 | A1 | 10/2015 | Meade et al. | |
| 2015/0340601 | A1* | 11/2015 | Huai | H01L 43/08 257/421 |
| 2016/0005954 | A1* | 1/2016 | Erickson | H01L 43/12 257/421 |
| 2016/0086645 | A1* | 3/2016 | Erickson | G11C 11/14 428/811.1 |
| 2016/0155932 | A1* | 6/2016 | Chen | H01L 43/08 257/427 |

FOREIGN PATENT DOCUMENTS

| | | |
|---|---|---|
| EP | 2385548 A1 | 11/2011 |
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2008270835 A | 11/2008 |
| JP | 2009194366 A | 8/2009 |
| JP | 2013145846 A | 7/2013 |
| KR | 1020040092342 A | 11/2004 |
| KR | 1020070094431 A | 9/2007 |
| KR | 1020080029852 A | 4/2008 |
| KR | 1020120008295 A | 1/2012 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012128891 A1 | 9/2012 |
| WO | 2012160937 A1 | 11/2012 |
| WO | 2013191920 A1 | 12/2013 |

OTHER PUBLICATIONS

Siddik et al., Semiconductor Devices, Magnetic Tunnel Junctions, and Methods of Fabrication Thereof, U.S. Appl. No. 14/597,903, filed Jan. 15, 2015.
Stone et al., Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Vitos et al., The Surface Energy of Metals, Surface Science, vol. 411, (1998), pp. 186-202.
Wang et al., "Low-Power Non-volatile Spintronic Memory: STT-MRAM and Beyond," J. Phys. D: Applied Physics, vol. 46, (Jan. 31, 2013), pp. 1-10.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wang et al., Exchange Coupling Between Ferromagnetic and Antiferromagnetic Layers via Ru and Application for a Linear Magnetic Field Sensor, Journal of Applied Physics, vol. 99, (2006), pp. 08H703-1-08H703-3.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate via Direction Variation of Heating Current, Scientific Reports, vol. 3, (Mar. 26, 2013), pp. 1-5.
You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
"Knovel Sampler," Knovel, (2003), http://app.knovel.com/web/view/html/show.v/rcid:kpKS000009/cid:kt003BCMZ2/viewerType:html/root_slug:front-matter/url_slug:front-matter?b-q=ioniz . . . ; 2 pages.
Ando et al., "Electrically Tunable Spin Injector Free from the Impedence Mismatch Problem," Nature Materials, vol. 10 (Sep. 2011), pp. 655-659.
Anonymous, "Crystal Structure," Wikipedia, https://en.wikipedia.org/wiki/Crystal_structure, (accessed Sep. 8, 2015), 13 pages.
Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
Auwarter et al., Co on h-Bn/Ni(1 1 1): From Island to Island-Chain Formation and Co Intercalation, Surface Science, vol. 511, (2002), pp. 379-386.
Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).
Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.
Butler et al., "Spin-Dependent Tunneling Conductance of Fe|MgO|Fe Sandwiches," Physical Review B, vol. 63, (Jan. 8, 2001), 054416-1-054416-12.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.
Chen et al., Advances and Future Prospects of Spin-Transfer Torque Random Access Memory, IEEE Transactions on Magnetics, vol. 46, No. 6, (Jun. 2010), pp. 1873-1878.
Chen et al., Magnetic Cell Structures, and Methods of Fabrication, U.S. Appl. No. 14/558,367, filed Dec. 2, 2014.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).
Farle et al., The Temperature Dependence of Magnetic Anisotropy in Ultra-Thin Films, Journal of Magnetism and Magnetic Materials, vol. 165, (1997), pp. 74-77.
Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Greenwood et al., Chemistry of Elements, Second Edition, (1997), pp. 23-25.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

(56) References Cited

OTHER PUBLICATIONS

Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Hindmarch et al., "Zirconium as a Boron Sink in Crystalline CoFeB/MgO/CoFeB Magnetic Tunnel Junctions," Applied Physics Express, vol. 4, (2011), pp. 013002-1-013002-3.

Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.

Kaufman, Myron, "Principles of Thermodynamics," Taylor & Francis Group LLC, (2002), Chap. 7: Chemical Reactions, 9 pages.

Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.

Kim et al., Effect of Annealing on Magnetic Exchange Coupling in CoPt/Co Bilayer Thin Films, Journal of Applied Physics, vol. 87, No. 9, (May 1, 2000), pp. 6140-6142.

Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).

Ko et al., Effects of MgO and MgO/Pd Seed-Layers on Perpendicular Magnetic Anisotropy of CoPd Thin Films, Thin Solid Films, vol. 519, (2011), pp. 8252-8255.

Kohda et al., Width and Temperature Dependence of Lithography-Induced Magnetic Anisotropy in (Ga,Mn)As Wires, Physica E, vol. 42, (2010), pp. 2685-2689.

Kurt et al., "Giant Tunneling Magnetoresistance with Electron Beam Evaporated MgO Barrier and CoFeB Electrodes," Journal of Applied Physics, No. 107 (Apr. 30, 2010), pp. 083920-1-083920-6.

Lavrijsen et al., Tuning the Interlayer Exchange Coupling Between Single Perpendicularly Magnetized CoFeB Layers, Appl. Phys. Lett., vol. 100, (2012), pp. 052411-1-052411-5.

Löhndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

Maehara et al., Tunnel Magnetoresistance Above 170% and Resistance-Area Product of 1 Ω (μm)2 Attained by In Situ Annealing of Ultra-Thin MgO Tunnel Barrier, Applied Physics Express, vol. 4, (2011), 2 pages (abstract only).

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Meade et al., Memory Cells, Methods of Fabrication, and Semiconductor Devices, U.S. Appl. No. 14/256,655, filed Apr. 18, 2014.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Miao et al., "Theoretical investigation on the transition-metal borides with Ta3B4-type structure: A class of hard and refractory materials," 2011, Computational Materials Science, Elsevier, pp. 1559-1566.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Rodmacq et al., Influence of Thermal Annealing on the Perpendicular Magnetic Anisotropy of Pt/Co/AlOx Trilayers, Physical Review B, vol. 79, (2009), pp. 024423-1-024423-8.

Sandhu et al., Memory Cells, Semiconductor Devices, and Methods of Fabrication, U.S. Appl. No. 14/516,347, filed Oct. 16, 2014.

Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.

* cited by examiner

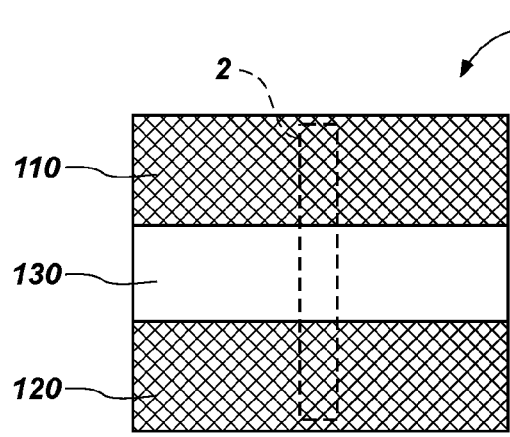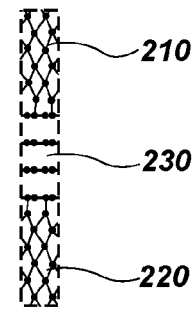
FIG. 1        FIG. 2
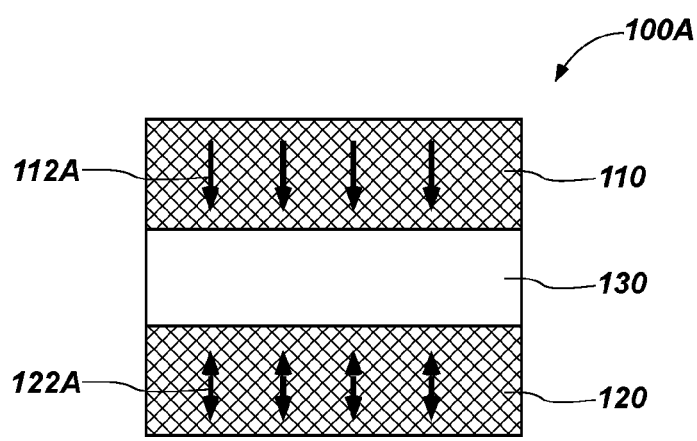
FIG. 1A
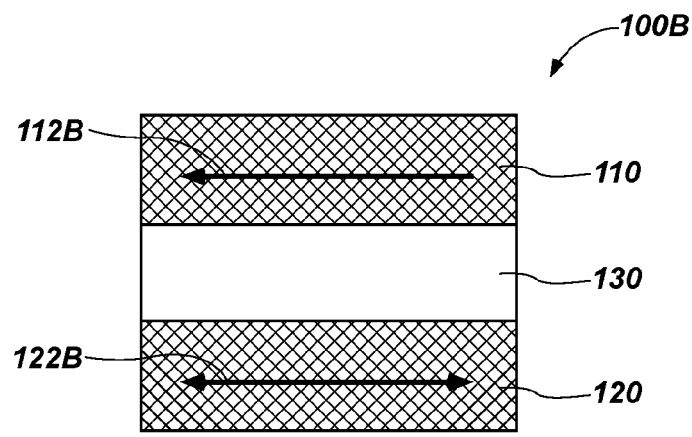
FIG. 1B

MAGNETIC MEMORY CELLS AND METHODS OF FABRICATION

CROSS-REFERENCE TO RELATED APPLICATION

This application is a continuation of U.S. patent application Ser. No. 14/256,655, filed Apr. 18, 2014, now U.S. Pat. No. 9,269,888, issued Feb. 23, 2016, the disclosure of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells, which may be otherwise known in the art as spin-transfer torque random-access memory (STT-RAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes a magnetic tunnel junction ("MTJ") having at least two magnetic regions, for example, a "fixed region" and a "free region," with a nonmagnetic, "tunnel" region between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the STT-MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the STT-MRAM cell is to be rewritten to a different configuration (i.e., to a different logic state).

Beneficial properties of free regions are often associated with the microstructure of the free regions. These properties include, for example, the cell's tunnel magnetoresistance ("TMR"). TMR is a ratio of the difference between the cell's electrical resistance in the anti-parallel configuration ($R_{ap}$) and its resistance in the parallel configuration ($R_p$) to $R_p$ (i.e., TMR=$(R_{ap}-R_p)/R_p$). Generally, a free region with a consistent crystal structure having few structural defects in the microstructure of its magnetic material has a higher TMR than a thin free region with structural defects. A cell with high TMR may have a high read-out signal, which may speed the reading of the STT-MRAM cell during operation. High TMR may also enable use of low programming current.

Efforts have been made to form magnetic memory cells having microstructures that are conducive for high TMR. However, selecting materials for and designing conventional magnetic memory cells with high TMR has presented challenges. For example, forming conventional magnetic materials with consistent, crystal microstructures has presented challenges at least because of differing magnetic structures in the MTJ and other regions of the memory cell. Efforts to improve crystallization in the MTJ have included formulating magnetic materials to initially include additives that enable the magnetic material to be formed in an initial, amorphous state, so that a desired crystal structure may later be propagated to the magnetic material as the additive is diffused out of the magnetic material. However, the diffusing additive can interfere with other materials and degrade other properties of the magnetic cell (e.g., magnetic anisotropy ("MA") strength, TMR). Therefore, formulating materials for and designing structures of magnetic memory cells to achieve high TMR, while not affecting other characteristics of the cell, such as MA strength, can present challenges.

BRIEF DESCRIPTION OF THE DRAWINGS

FIG. 1 is a cross-sectional, elevational, schematic illustration of a magnetic tunnel junction ("MTJ") of a magnetic cell core, according to an embodiment of the present disclosure.

FIG. 1A is a cross-sectional, elevational, schematic illustration of the MTJ of FIG. 1, according to an embodiment of the present disclosure, wherein a free region and a fixed region exhibit out-of-plane magnetic orientations.

FIG. 1B is a cross-sectional, elevational, schematic illustration of the MTJ of FIG. 1, according to an embodiment of the present disclosure, wherein a free region and a fixed region exhibit in-plane magnetic orientations.

FIG. 2 is a view of box 2 of FIG. 1, illustrating, in simplified form, the microstructural alignment of the materials of the MTJ of FIG. 1.

DETAILED DESCRIPTION

Figure 3:
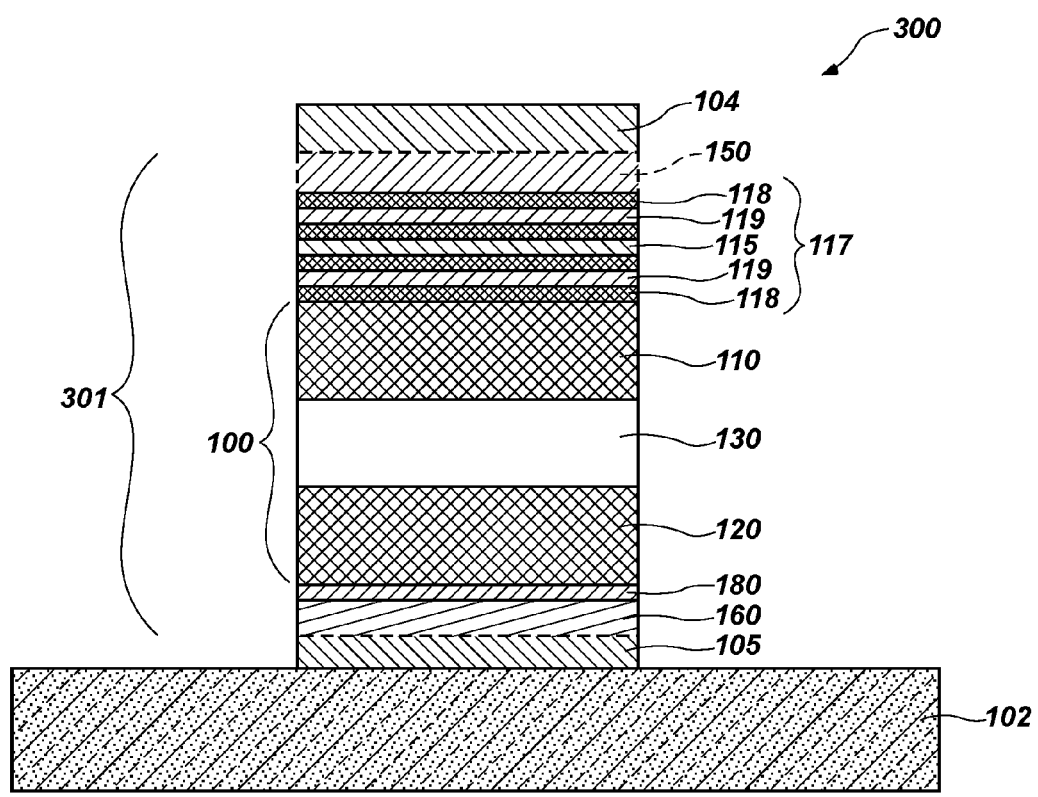
FIG. 3 is a cross-sectional, elevational, schematic illustration of a magnetic cell structure according to an embodiment of the present disclosure, wherein the magnetic cell structure is configured as a top-pinned magnetic memory cell and includes a single seed region underlying an MTJ.

Memory cells, semiconductor devices, memory systems, electronic systems, and methods of forming memory cells are disclosed. The memory cells include a magnetic tunnel junction ("MTJ") comprising a pair of magnetic regions on opposite sides of a nonmagnetic, tunnel barrier region. Each of the magnetic regions and the nonmagnetic tunnel barrier region exhibit a hexagonal crystal structure, and the materials of the MTJ form a microstructure with the crystalline structures of each material oriented relative to one another in what is characterized herein as an "aligned lattice microstructure," i.e., a crystal structure in which the crystal structures of adjoining, different materials interface in a substantially-consistent, repeating pattern. To enable formation of the hexagonal crystal structure of each material and the aligned lattice microstructure of the MTJ, the MTJ is disposed proximate to a seed region that exhibits the desired hexagonal crystal structure. The hexagonal crystal structure of the seed region either effects the hexagonal crystal structure of the materials of the MTJ as the materials are formed over the seed region, or, alternatively, the hexagonal crystal structure of the seed region is propagated to the materials of the MTJ after precursor materials of the MTJ are formed. In any case, the resulting MTJ includes a substantially aligned, consistent (i.e., substantially defect-free) microstructural lattice with hexagonal crystal materials. Such an aligned MTJ structure may exhibit a high tunnel magnetoresistance ("TMR") and a high magnetic anisotropy ("MA").

As used herein, the terms "high tunnel magnetoresistance" and "high TMR" mean and refer to a TMR greater than about 2.00 (200%).

As used herein, the terms "high magnetic anisotropy" and "high MA," mean and refer to MA strength greater than about 1,000 Oersted.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including an MTJ. The MTJ includes a nonmagnetic, "tunnel barrier" region disposed between two magnetic regions, i.e., a free region and a fixed region. The nonmagnetic tunnel barrier region may be an electrically insulative (e.g., dielectric) region.

As used herein, the terms "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more nonmagnetic materials.

As used herein, the term "magnetic material" means and includes ferromagnetic materials, ferrimagnetic materials, antiferromagnetic, and paramagnetic materials.

As used herein, the term "coupler," when referring to a material, region, or sub-region, means and includes a material, region, or sub-region formulated or otherwise configured to antiferromagnetically couple neighboring magnetic materials, regions, or sub-regions.

As used herein, the term "precursor," when referring to a material or structure, means and refers to a material or structure to be transformed into a resulting material or structure. For example, and without limitation, a "precursor material" may refer to a material having an initial microstructure (e.g., an amorphous structure) that is to be converted into a different, final microstructure (e.g., a crystal structure), and "a precursor structure" may refer to a structure of materials or regions to be patterned to transform the precursor structure into a resulting, patterned structure (e.g., a magnetic cell structure).

As used herein, the term "to template," means and refers to the act of one material orienting its crystal structure to the crystal structure of another material during fabrication of the one material such that the two materials have matching crystal structures.

As used herein, the term "matching," when used to compare one material's crystal structure to the crystal structure of another adjoining material, means and refers to the two materials having, at least along an interface between the two materials, crystal structures classified in the same geometric crystal system (e.g., both hexagonal, both cubic) and similar lattice lengths of the material's unit cell face directed toward the interface. As used herein, "similar lattice lengths" mean and refer to lattice lengths differing, if at all, by less than about 10% (e.g., less than about 6%, e.g., less than about 5%). For example and without limitation, "matching" crystal structures may include two hexagonal crystal structures adjoining one another along an interface with the basal (i.e., hexagon-shaped) face of each directed toward the other and with an a-axis lattice length that differs by less than about 10%. The c-axis lattice lengths of the crystal structures (i.e., the heights of the prismatic faces) may nonetheless differ by more or less than about 10% with the crystal structures nonetheless referred to herein as "matching."

As used herein, the term "hexagonal crystal structure," means and refers to a crystal structure defined by at least one hexagonal face.

As used herein, unless the context indicates otherwise, the term "formed from," when describing a material or region, refers to a material or region that has resulted from an act that produced a transformation of a precursor material or precursor region.

As used herein, the term "fixed region" means and includes a magnetic region within the STT-MRAM cell that includes a magnetic material and that has a fixed, or substantially fixed, magnetic orientation during use and operation of the STT-MRAM cell in that a current or applied field effecting a change in the magnetization direction of one magnetic region (e.g., the free region) of the cell core may not effect a change in the magnetization direction of the fixed region. The fixed region may include one or more magnetic materials and, optionally, one or more nonmagnetic materials. For example, the fixed region may include a synthetic antiferromagnet (SAF) including a coupler sub-region of ruthenium (Ru) adjoined by alternating sub-regions of magnetic and conductive materials. Alternatively, the fixed region may include structures of alternating sub-regions of magnetic material and coupler material. Each of the magnetic sub-regions may include one or more materials and one or more sub-regions therein. As another example, the fixed region may be configured as a single, homogeneous, magnetic material. Accordingly, the fixed region may have uniform magnetization or sub-regions of differing magnetization that, overall, effect the fixed region having a fixed, or substantially fixed, magnetic orientation during use and operation of the STT-MRAM cell.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region," means and includes a region included in another region. Thus, one magnetic region may include one or more magnetic sub-regions, i.e., sub-regions of magnetic material, as well as nonmagnetic sub-regions, i.e., sub-regions of nonmagnetic material.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, species, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), laser ablation, or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic tunnel junction ("MTJ") in a magnetic cell core. The MTJ includes a nonmagnetic, tunnel barrier region between a magnetic region and another magnetic region. Each of the regions of the MTJ has a crystal structure that effects a high tunnel magnetoresistance (TMR). The crystal structure is enabled by the MTJ's proximity to a seed region that exhibits the desired crystal structure.

With reference to FIG. 1, illustrated is an MTJ 100 of embodiments of the present disclosure. The MTJ 100 includes a magnetic region and another magnetic region, for example, a "fixed region" 110 and a "free region" 120, respectively. A nonmagnetic "tunnel barrier region" 130 is disposed between the two magnetic regions.

In some embodiments, each of the fixed region 110, the free region 120, and the tunnel barrier region 130 may have a thickness of about 0.25 nm to about 2 nm each, for a total thickness of the MTJ 100 of about 0.75 nm to about 6 nm. For example, and without limitation, one or more of the fixed region 110, the free region 120, and the tunnel barrier region 130 may be formed as a single monolayer.

The fixed region 110 exhibits a magnetic orientation that is at least substantially fixed, while the free region 120 exhibits a magnetic orientation that is switchable. With reference to FIG. 1A, in some embodiments, an MTJ 100A may be configured for an out-of-plane STT-MRAM cell. Thus, the fixed region 110 exhibits an at least substantially fixed vertical magnetic orientation, as indicated by arrows 112A, while the free region 120 exhibits a switchable vertical magnetic orientation, as indicated by arrows 122A. With reference to FIG. 1B, in other embodiments, an MTJ 100B may be configured for an in-plane STT-MRAM cell. Thus, the fixed region 110 exhibits an at least substantially fixed horizontal magnetic orientation, as indicated by arrows 112B, while the free region 120 exhibits a switchable horizontal magnetic orientation, as indicated by arrows 122B.

The MTJ 100 of FIG. 1, and of any other embodiment disclosed herein, may be configured to have an aligned lattice microstructure, as illustrated in FIG. 2. FIG. 2 illustrates, in simplified form, the atomic bonds of an example crystal structure about an interface between a magnetic material 210 of the fixed region 110 (FIG. 1) and a nonmagnetic material 230 of the tunnel barrier region 130 and about an interface between the nonmagnetic material 230 and another magnetic material 220 of the free region 120 (FIG. 1). The illustrated aligned lattice microstructure may be substantially consistent across a width of the materials. That is, the structure illustrated in FIG. 2 may be repeated across the width of the materials.

The nonmagnetic material 230 may be bonded with each of the magnetic material 210 and the another magnetic material 220 by inter-material bonds that span the respective interface. Each of the magnetic material 210, the nonmagnetic material 230, and the another magnetic material 220 may exhibit a crystal structure in the same geometric crystal system (e.g., a hexagonal crystal structure).

In one particular example, according to an embodiment of the present disclosure, the magnetic material 210 and the another magnetic material 220 may both comprise, consist essentially of, or consist of hexagonal cobalt (h-Co), and the nonmagnetic material 230 may comprise, consist essentially of, or consist of hexagonal boron nitride (h-BN). The h-Co and the h-BN may have matching crystal structures, e.g., matching hexagonal (0001) crystal structures. The a-lattice length of h-Co may be about 2.5 Å (e.g., about 2.51 Å), and the a-lattice length of the h-BN may also be about 2.5 Å (e.g., about 2.51 Å).

The h-Co of the magnetic material 210 and the another magnetic material 220 may exhibit a hexagonal close-packed (hcp) crystal structure, e.g., an hcp (0001) crystal structure. Thus, as illustrated in FIG. 2, levels of h-Co in the magnetic material 210 and the another magnetic material 220 are offset from one another as they alternate, with a cobalt atom of a lower level laterally between cobalt atoms of an upper level.

The h-BN of the nonmagnetic material 230 may not exhibit a close-packed structure (e.g., an hcp structure), but may nonetheless exhibit a hexagonal (0001) crystal structure. Thus, the basal surface (i.e., the hexagonal face) of the h-BN may be exposed to the magnetic material 210 and to the another magnetic material 220. The hexagonal ring of h-BN is defined by atoms of boron alternating with atoms of nitrogen about the ring, with each atom of boron bonded to two neighboring nitrogen atoms, and vice versa. The atoms of boron and atoms of nitrogen may also alternate through the levels of the h-BN lattice, with each atom of boron bonded to two atoms of nitrogen, above and below, and vice versa.

In the aligned lattice microstructure of the MTJ 100, the basal surface (i.e., the hexagonal face) of each of the h-Co and the h-BN may be substantially parallel with one another and with the interfaces defined between the materials. At the interfaces, each nitrogen (N) atom of the h-BN hexagonal face may bond with a cobalt (Co) atom of the periphery of the hexagonal face of the h-Co. This pattern may be substantially consistent across the interfaces, to define the aligned lattice microstructure in the MTJ 100.

The matching crystal structures of the materials of the MTJ 100 (e.g., the magnetic material 210, the another magnetic material 220, and the nonmagnetic material 230) and the alignment between the materials in the aligned lattice microstructure may enable the MTJ 100 to exhibit a high TMR. The h-Co|h-BN|h-Co aligned lattice microstructure may also enable the MTJ 100 to exhibit other desirable characteristics for a magnetic cell, such as low damping and high MA strength. Low damping may enable use of a low programming current during programming of the cell, and the high MA strength may inhibit the cell from prematurely switching, e.g., during storage.

To form the materials of the MTJ 100 with the desired crystal structure (e.g., a hexagonal crystal structure, e.g., a hexagonal (0001) crystal structure) and in the aligned lattice microstructure, the MTJ 100 may be formed proximate to a seed material, which may have a "desired crystal structure," i.e., a crystal structure matching that of the crystal structure of the adjoining magnetic material (e.g., the magnetic material 210 or the another magnetic material 220) in the MTJ 100. The proximity of the MTJ 100 to the seed material may enable the seed material's crystal structure to effect the crystal structure in the materials of the MTJ 100. For example, the materials of the MTJ 100 may be formed (e.g., sputtered) over the seed material having the desired crystal structure, with the materials templating to the underlying seed material. Thus, the crystal structure in the materials of the MTJ 100 may be epitaxially grown from the seed material's desired crystal structure. Alternatively, or additionally, the materials of the MTJ 100 may be formed (e.g., sputtered) with a precursor microstructure (e.g., an amorphous microstructure) and later converted (e.g., during annealing) to the desired crystal structure through solid phase epitaxy, i.e., through propagation of the desired crystal structure from the seed material. In such embodiments, the seed material may be under, over, or both under and over the materials of the MTJ 100.

In one particular example, in embodiments in which the MTJ 100 is formed with an h-Co|h-BN|h-Co aligned lattice microstructure (e.g., as in FIG. 2), in which the magnetic material 210 of the fixed region 110 is h-Co with a hexagonal (0001) crystal structure, the nonmagnetic material 230 of the tunnel barrier region 130 is h-BN with the hexagonal (0001) crystal structure, and the another magnetic material 220 of the free region 120 is h-Co with the hexagonal (0001) crystal structure, the seed material (e.g., hexagonal zinc (h-Zn), hexagonal ruthenium (h-Ru)) may exhibit the hexagonal (0001) crystal structure such that its basal surface is substantially parallel with the basal surfaces of the h-Co and h-BN.

The seed material may be selected such that its crystal structure and lowest energy surface matches that of the materials of the MTJ 100 and such that the seed material's lattice length (e.g., its a-axis lattice length) differs only minimally (e.g., less than about 10% difference, e.g., less than about 6% difference, e.g., about 5% or less difference) from the corresponding lattice length (e.g., the a-axis lattice length) of the materials of the MTJ 100. For example, h-Zn (0001) has an a-axis lattice length of about 2.66 Å, which differs from the corresponding a-axis lattice length of the h-Co (i.e., about 2.51 Å) by less than about 6%. Because of the minimal difference in lattice lengths between the seed material and the proximate material of the MTJ 100 (e.g., the magnetic material 210 or the another magnetic material 220), the materials of the MTJ 100 may template on the crystal structure of the seed material without causing high residual strain in the crystal structure of the MTJ 100. Therefore, the aligned lattice microstructure (see FIG. 2) of the MTJ 100 may be achieved free or substantially free of defects in the microstructure, and the high TMR may be achieved.

Without being limited to any one particular theory, it is contemplated that the proximity of the seed material, having the desired crystal structure, to the materials of the MTJ 100 enables formation of the materials of the MTJ 100 with a more perfect crystal structure (i.e., a crystal structure with fewer structural defects) than would be achievable were the same MTJ 100 structure to be formed under influence of a neighboring material having other than the desired crystal structure. It is expected that, were the materials of the MTJ 100 to be formed on or otherwise under the influence of a neighboring region having a different crystalline microstructure to the desired crystal structure, or even an amorphous microstructure, the materials of the MTJ 100 may be inhibited from exhibiting the desired crystal structure, or the crystal structure or structures exhibited may include defects due, for example, to a mis-alignment between the materials of the MTJ 100 and the neighboring material with the different crystal structure. Therefore, forming the MTJ 100 proximate to the seed material may enable the aligned lattice microstructure with fewer defects in the microstructure than may be achieved in the absence of the seed material.

To enable the seed material to exhibit the desired crystal structure (e.g., the hexagonal crystal structure, e.g., the hexagonal (0001) crystal structure), the seed material may be formed proximate to (e.g., on) a "foundation material," which may be configured to be amorphous when the seed material is formed proximate thereto.

In embodiments in which the seed material is formed on the amorphous, foundation material, the amorphous nature of the foundation material may enable the seed material to adopt a preferential crystal structure. Because the seed material may be selected such that its preferential crystal structure is the desired crystal structure, forming the seed material over the foundation material may enable the seed material to be initially formed to exhibit the desired crystal structure. Without being limited to any particular theory, it is contemplated that, were the seed material to be formed on a crystalline material having a crystal structure other than the desired crystal structure, the seed material may template to the other crystal structure and not achieve the desired crystal structure. Therefore, forming the seed material on an amorphous foundation material may enable the seed material to be formed to exhibit the desired crystal structure, which enables the subsequent formation of the materials of the MTJ 100 to template to the desired crystal structure of the seed material.

In some embodiments, the seed material may be formed over the materials of the MTJ 100, and the desired crystal structure may be later propagated to the materials of the MTJ 100 through solid phase epitaxy. In such embodiments, the material of the MTJ 100 on which the seed material is formed (e.g., the magnetic material 210 or the another magnetic material 220) may be formulated and configured to be initially amorphous. Thus, when the seed material is formed thereon, the seed material may be formed in its preferential crystal structure, i.e., the desired crystal structure. In such embodiments, the amorphous material of the MTJ 100 adjacent the seed material may be characterized herein as a "precursor material." Following formation of the seed material, with its desired crystal structure, on the precursor material of the MTJ 100, the desired crystal structure may be propagated from the seed material to the precursor material to convert the precursor material into a crystalline material exhibiting the desired crystal structure. The precursor material may be formulated to be amorphous, when initially formed, due to inclusion of one or more additives in the precursor material, the presence of which effects the amorphous structure. The additives may diffuse out from the precursor material, e.g., during a subsequent anneal, while the desired crystal structure is propagated from the seed material to crystallize the precursor material less the additive or additives.

In other embodiments, the seed material may overlay the MTJ 100 with an intermediate amorphous material (not illustrated) disposed between. Thus, the seed material may be formed to exhibit the desired crystal structure upon formation. During a subsequent anneal, the desired crystal structure may be propagated to both the intermediate amorphous material and the material of the MTJ 100 adjacent to the intermediate now-crystalline material.

In any case, the proximity of the crystalline seed material to the materials of the MTJ 100, whether the seed material is under, over, or both under and over, the materials of the MTJ 100, enables the materials of the MTJ 100 to be formed, either initially or through propagation, with a desired crystal structure. Thus, the materials of the MTJ 100, having corresponding crystal structures, may be formed to exhibit an aligned lattice microstructure (see FIG. 2) that enables a high TMR.

With reference to FIGS. 3 through 8, illustrated are various embodiments of magnetic cell structures including the MTJ 100 of FIG. 1. With reference to FIG. 3, the MTJ 100 is included in a magnetic cell structure 300 configured for a "top-pinned" magnetic memory cell with a single seed region 180 underlying the MTJ 100. The magnetic cell structure 300 includes a magnetic cell core 301 over a substrate 102. The magnetic cell core 301 may be disposed between an upper electrode 104 above and a lower electrode 105 below.

The magnetic cell core 301 includes the MTJ 100, with the fixed region 110, the free region 120, and the nonmagnetic, tunnel barrier region 130 between.

Adjacent the fixed region 110 may be another magnetic region, e.g., a "reference region" 117. The reference region 117 may be configured to include a synthetic antiferromagnet (SAF) structure comprising, for example and without limitation, magnetic sub-regions 118 alternating with conductive sub-regions 119 above and below a coupler sub-region 115. The conductive sub-regions 119 may cause the magnetic sub-regions 118 to exhibit a perpendicular magnetic orientation (e.g., the fixed vertical magnetic orientation 112A of FIG. 1A), while the coupler sub-region 115 may be formulated and positioned to enable anti-parallel coupling of the magnetic sub-regions 118 adjacent to the coupler sub-region 115.

In other embodiments, the magnetic cell core 300 includes the fixed region 110 without an adjacent reference region (e.g., without the reference region 117).

As illustrated in FIG. 3, the free region 120 may be formed proximate to (e.g., over) a seed region 180, which may be formed proximate to (e.g., over) a foundation region 160. The seed region 180 is formed from the seed material described above. Therefore, the seed region 180 exhibits a desired crystal structure (e.g., a hexagonal crystal structure (e.g., a hexagonal (0001) crystal structure)).

The foundation region 160 is formed from the foundation material described above. Therefore, the foundation region 160 is amorphous, and it may be formed over (e.g., directly over) the lower electrode 105. As illustrated in FIG. 3, in some embodiments, the foundation region 160 may be configured to be a sub-region of the lower electrode 105. In such embodiments, the foundation region 160 may be formed of an amorphous conductive material, e.g., a metallic glass, e.g., a boron ruthenium tungsten (BRuW) alloy, a ruthenium tungsten (RuW) alloy, a binary metallic. The conductive material of the foundation region 160 may allow programming current to pass through the magnetic cell core 301 without substantial electrical resistance in the foundation region 160. Moreover, as described above, the amorphous nature of the foundation region 160 may enable the seed material of the seed region 180 to be formed to exhibit its preferential crystal structure, which is the desired crystal structure for the materials of the MTJ 100.

The thickness of each of the foundation region 160 and the seed region 180 may be selected to provide the sufficient surface on which to form overlying materials. For example, and without limitation, the foundation region 160 may be about one nanometer (about 1 nm) to about ten nanometers (about 10 nm) in thickness, while the seed region 180 may be about one nanometer (about 1 nm) to about ten nanometers (about 10 nm) in thickness.

One or more upper intermediary regions 150 may, optionally, be disposed over the magnetic regions of the magnetic cell structure 300. The upper intermediary regions 150, if included, may be configured to inhibit diffusion of species between the upper electrode 104 and the materials of the reference region 117. Alternatively or additionally, the upper intermediary regions 150 may include materials configured to act as etch stops during subsequent patterning processes.

Accordingly, disclosed is a memory cell comprising a magnetic cell core. The magnetic cell core comprises a magnetic region exhibiting a hexagonal crystal structure and another magnetic region exhibiting the hexagonal crystal structure. A tunnel barrier region is disposed between the magnetic region and the another magnetic region. The tunnel barrier region exhibits another hexagonal crystal structure. A seed region is proximate to at least one of the magnetic region or the another magnetic region, and the seed region exhibits a hexagonal crystal structure matching the hexagonal crystal structure of the at least one of the magnetic region or the another magnetic region.

Figure 4:
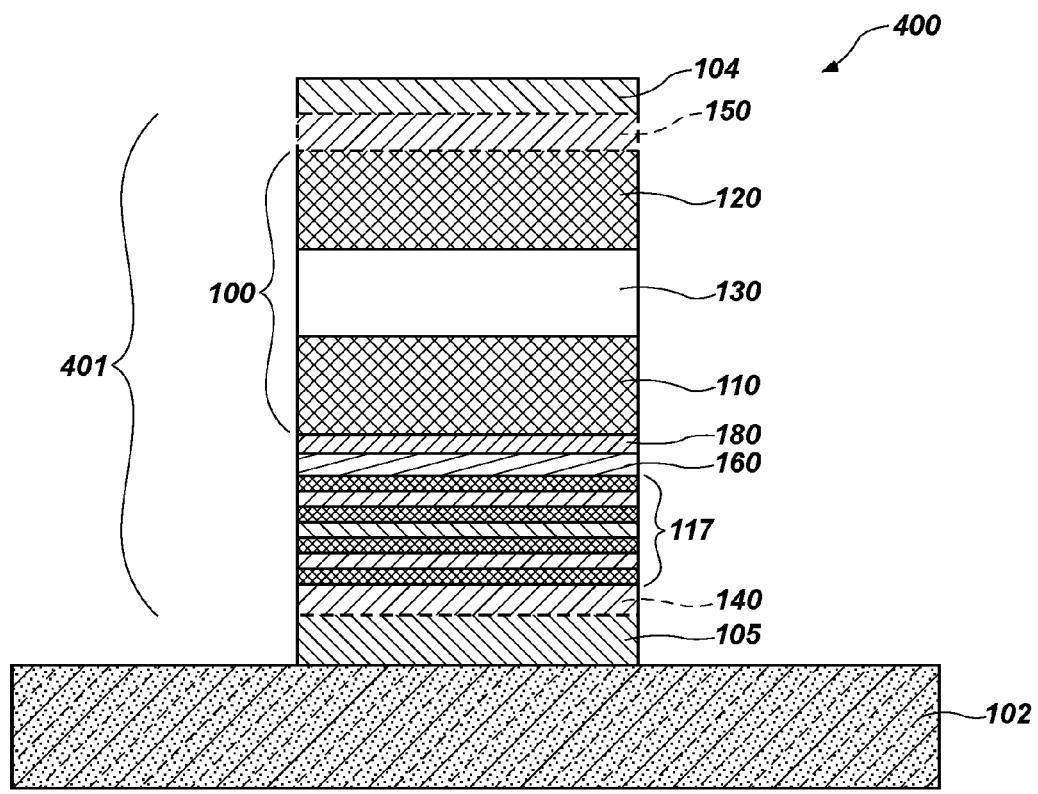
FIG. 4 is a cross-sectional, elevational, schematic illustration of a magnetic cell structure according to an embodiment of the present disclosure, wherein the magnetic cell structure is configured as a bottom-pinned magnetic memory cell and includes a single seed region underlying an MTJ.

With reference to FIG. 4, illustrated is a magnetic cell structure 400 including the MTJ 100 and configured for a "bottom-pinned" magnetic memory cell with a single seed region (e.g., the seed region 180) underlying the MTJ 100. A magnetic cell core 401 of the magnetic cell structure 400 includes the MTJ 100 over the seed region 180, which is over the foundation region 160. The seed region 180 and the foundation region 160 may be disposed between the fixed region 110 and the reference region 117.

According to the embodiment of FIG. 4, the foundation region 160 may be amorphous and enable formation of the seed region 180 over the foundation region 160 with the desired crystal structure. The magnetic material 210 (FIG. 2) of the fixed region 110 may then be formed on the seed region 180, templating on the desired crystal structure. Likewise, the nonmagnetic material 230 (FIG. 2) of the tunnel barrier region 130 may be formed to template on the desired crystal structure of the fixed region 110, and the another magnetic material 220 (FIG. 2) of the free region 120 may be formed to template on the desired crystal structure of the tunnel barrier region 130. Therefore, the MTJ 100 with the desired crystal structure (e.g., a hexagonal crystal structure (e.g., a hexagonal (0001) crystal structure)) may be formed due to the formation of the MTJ 100 over the material of the seed region 180.

As illustrated in FIG. 4, the magnetic cell structure 400 may, optionally, include lower intermediary regions 140 disposed under the magnetic regions (e.g., the free region 120, the fixed region 110, and the reference region 117). The lower intermediary regions 140, if included, may be configured to inhibit diffusion of species between the lower electrode 105 and overlying materials during operation of the memory cell.

Figure 5:
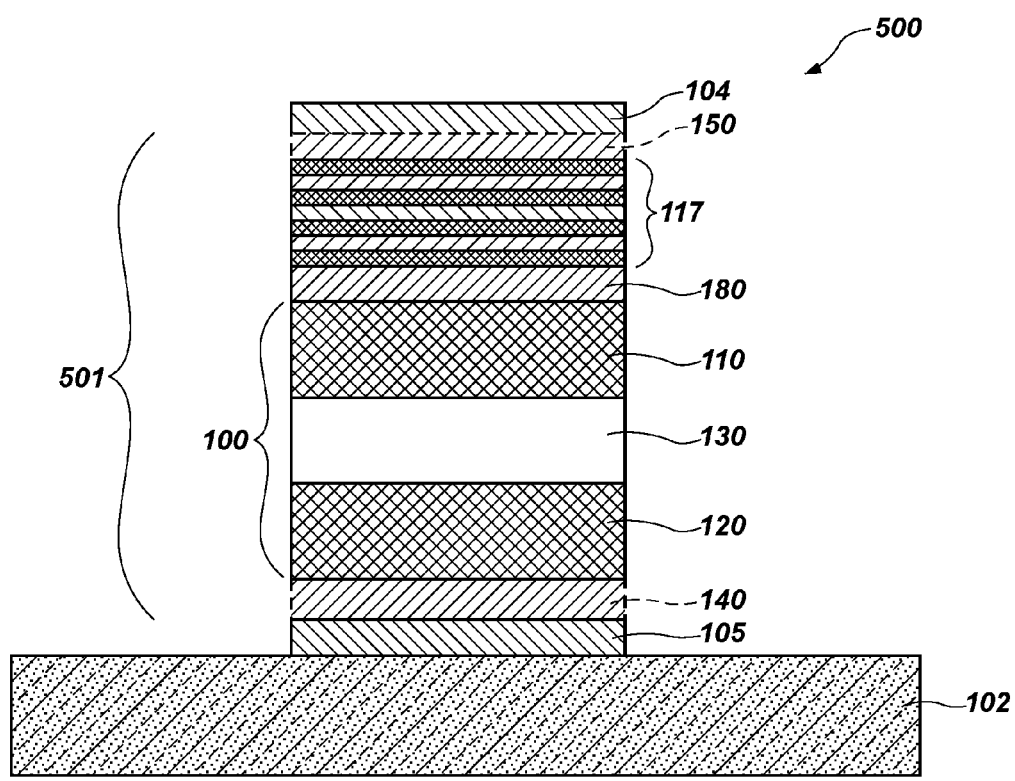
FIG. 5 is a cross-sectional, elevational, schematic illustration of a magnetic cell structure according to an embodiment of the present disclosure, wherein the magnetic cell structure is configured as a top-pinned magnetic memory cell and includes a single seed region overlying an MTJ.

With reference to FIG. 5, illustrated is a magnetic cell structure 500 including the MTJ 100 and configured for a "top-pinned" magnetic memory cell with a single seed region (e.g., the seed region 180) overlying the MTJ 100. The seed region 180 may be included, in a magnetic cell core 501 of the magnetic cell structure 500, between the fixed region 110 and the reference region 117.

Optionally, an amorphous foundation region (e.g., the foundation region 160 of FIG. 4) may be included between the seed region 180 and the magnetic material 210 (FIG. 2) of the fixed region 110 to enable the seed material of the seed region 180 to be formed at the desired crystal structure. Alternatively, for example, the magnetic material 210 (FIG. 2) of the fixed region 110 may be formed from a precursor material that is amorphous so that the seed region 180 may be formed having the desired crystal structure. The desired crystal structure may be propagated to the precursor material to convert the material of the fixed region 110 to the desired crystal structure. The desired crystal structure may continue to propagate down through the tunnel barrier region 130 and the free region 120 of the MTJ 100 to ensure the materials of the MTJ 100 all have matching crystal structures.

Figure 6:
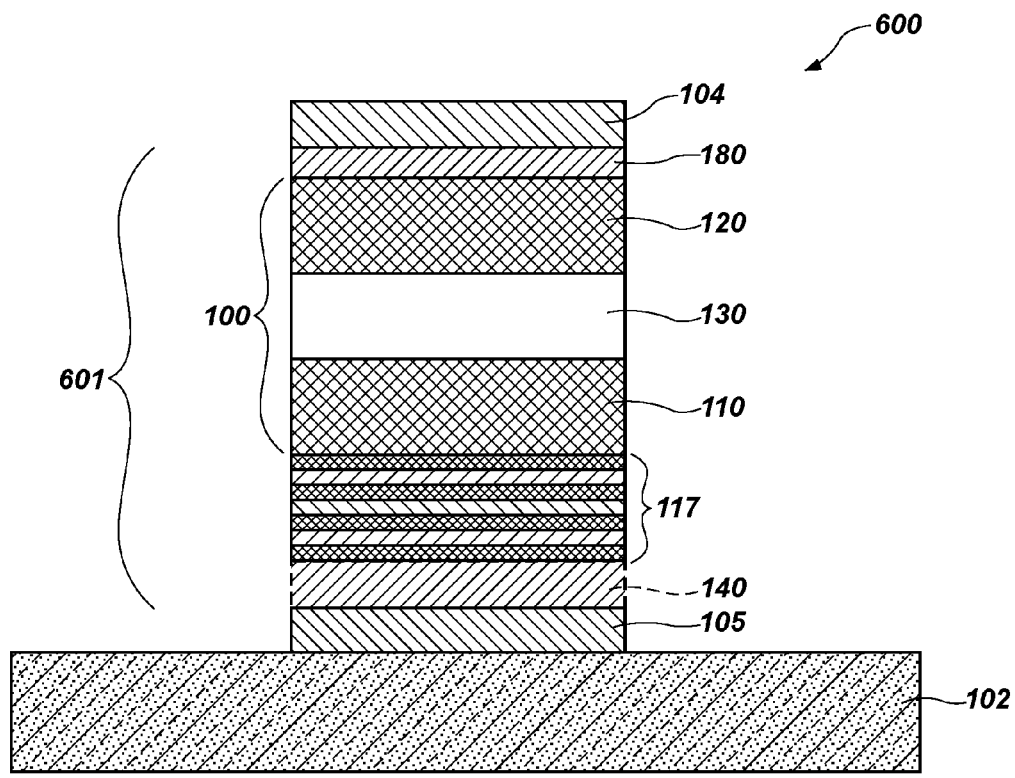
FIG. 6 is a cross-sectional, elevational, schematic illustration of a magnetic cell structure according to an embodiment of the present disclosure, wherein the magnetic cell structure is configured as a bottom-pinned magnetic memory cell and includes a single seed region overlying an MTJ.

With reference to FIG. 6, illustrated is a magnetic cell structure 600 with a magnetic cell core 601 including the MTJ 100 and configured for a "bottom-pinned" magnetic memory cell with a single seed region (e.g., the seed region 180) overlying the MTJ 100. The seed region 180 may be disposed between the free region 120 and the upper electrode 104. Optionally, one or more upper intermediary regions 150 (see FIG. 5) may be included between the upper electrode 104 and the seed region 180.

Optionally, an amorphous foundation region (e.g., the foundation region 160 of FIG. 4) may be disposed between the seed region 180 and the free region 120 to enable the seed region 180 to be formed at the desired crystal structure, i.e., its preferential crystal structure. Alternatively, the magnetic material of the free region 120 may be formed from an amorphous precursor material to the another magnetic material 220 (FIG. 2) of the free region 120. The desired crystal structure of the seed region 180 may be propagated down through the amorphous precursor material and the other materials of the MTJ 100 during subsequent processing (e.g., during an anneal) to enable the materials of the MTJ 100 to have crystal structures matching the desired crystal structure and one another.

Figure 7:
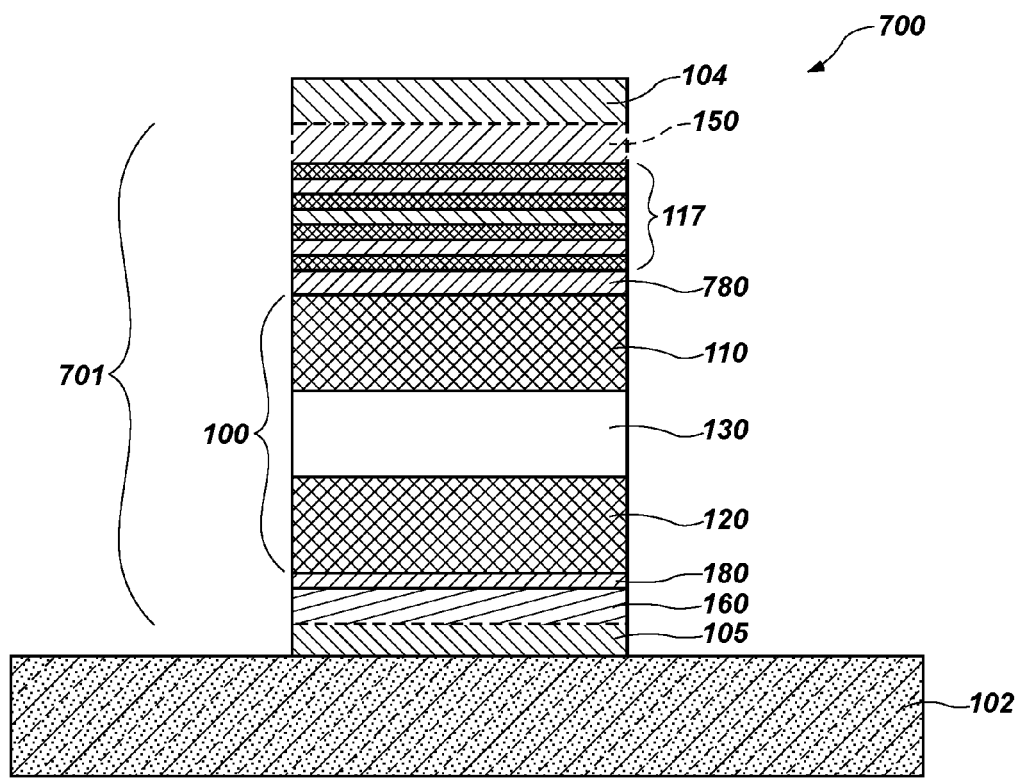
FIG. 7 is a cross-sectional, elevational, schematic illustration of a magnetic cell structure according to an embodiment of the present disclosure, wherein the magnetic cell structure is configured as a top-pinned magnetic memory cell and includes dual seed regions, one overlying an MTJ and another underlying the MTJ.

With reference to FIG. 7, illustrated is a magnetic cell structure 700 with a magnetic cell core 701 including the MTJ 100 and configured for a "top-pinned" magnetic memory cell with dual seed regions, i.e., the seed region 180 and another seed region 780, below and above, respectively, the MTJ 100. The seed region 180 may be disposed on an amorphous foundation region 160, which may enable the seed region 180 to be formed at the desired crystal structure. The another seed region 780 may be disposed between the fixed region 110 and the reference region 117.

With dual seed regions (i.e., the seed region 180 and the another seed region 780), the desired crystal structure may be promoted from both below and above the MTJ 100. For example, the seed region 180, underlying the MTJ 100, may enable the another magnetic material 220 (FIG. 2) of the free region 120 to form, by epitaxial crystal growth, the desired crystal structure exhibited by the seed region 180. The tunnel barrier region 130 may form, also by epitaxial crystal growth, the desired crystal structure of the free region 120. The fixed region 110 may form, by epitaxial crystal growth, the desired crystal structure of the tunnel barrier region 130. Moreover, during a subsequent anneal, the desired crystal structure exhibited by the another seed region 780 may be propagated downward, by solid phase epitaxy, into the MTJ 100 to further promote the crystal structure exhibited by materials of the MTJ 100.

The seed material of the seed region 180 and the another seed region 780 may be the same or different materials. However, it is contemplated that the seed materials, whether the same or different, be selected to exhibit the desired crystal structure to enable formation of the MTJ 100 with the aligned lattice microstructure. Thus, high TMR and other desirable characteristics (e.g., high MA strength and low damping) may be achieved.

Figure 8:
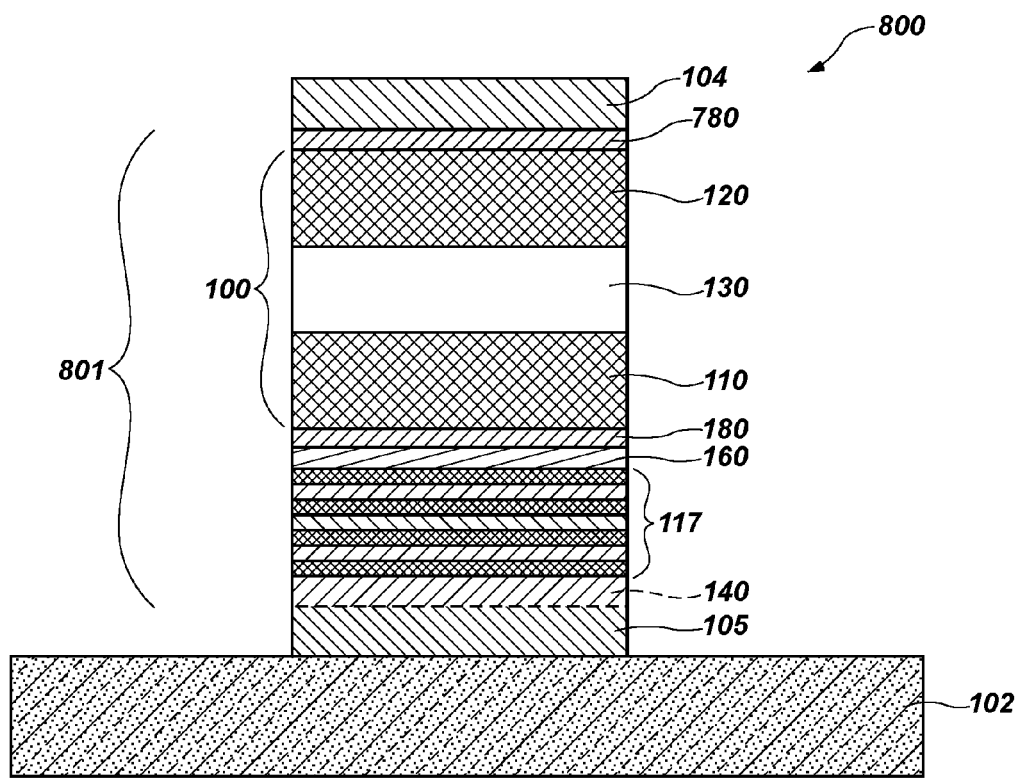
FIG. 8 is a cross-sectional, elevational, schematic illustration of a magnetic cell structure according to an embodiment of the present disclosure, wherein the magnetic cell structure is configured as a bottom-pinned magnetic memory cell and includes dual seed regions, one overlying an MTJ and another underlying the MTJ.

With reference to FIG. 8, illustrated is a magnetic cell structure 800 having a magnetic cell core 801 that includes the MTJ 100 and configured for a "bottom-pinned" magnetic memory cell with dual seed regions, e.g., the seed region 180 and the another seed region 780, below and above, respectively, the MTJ 100. The seed region 180 may be disposed between the fixed region 110 and the reference region 117. The amorphous foundation region 160 may be between the seed region 180 and the reference region 117.

As with the embodiment of FIG. 7, the dual seed regions may promote the desired crystal structure in the MTJ 100 from both above and below. The seed region 180, below the MTJ 100, may enable templating of the desired crystal structure as the materials of the MTJ 100 are initially formed, e.g., by epitaxial crystal growth, while the another seed region 780, above the MTJ 100, may enable propagation of the desired crystal structure, e.g., by solid phase epitaxy, downward into the materials of the MTJ 100, such as during a subsequent anneal.

In any of the foregoing magnetic cell structures 300 (FIG. 3), 400 (FIG. 4), 500 (FIG. 5), 600 (FIG. 6), 700 (FIG. 7), 800 (FIG. 8), the MTJ 100 may be formed as an h-Co|h-BN|h-Co aligned lattice microstructure, and the seed region 180 and, if present, the another seed region 780 may be formed of h-Zn or another conductive material having a crystal structure matching that of h-Co. Additionally, the foundation region 160, if present, may be formed of an amorphous conductive material.

Accordingly, disclosed is a memory cell comprising a magnetic cell core. The magnetic cell core comprises a magnetic tunnel junction adjacent a seed region exhibiting a hexagonal crystal structure. The magnetic tunnel junction comprises hexagonal boron nitride between hexagonal cobalt. An amorphous region is adjacent the seed region.

Figure 9:
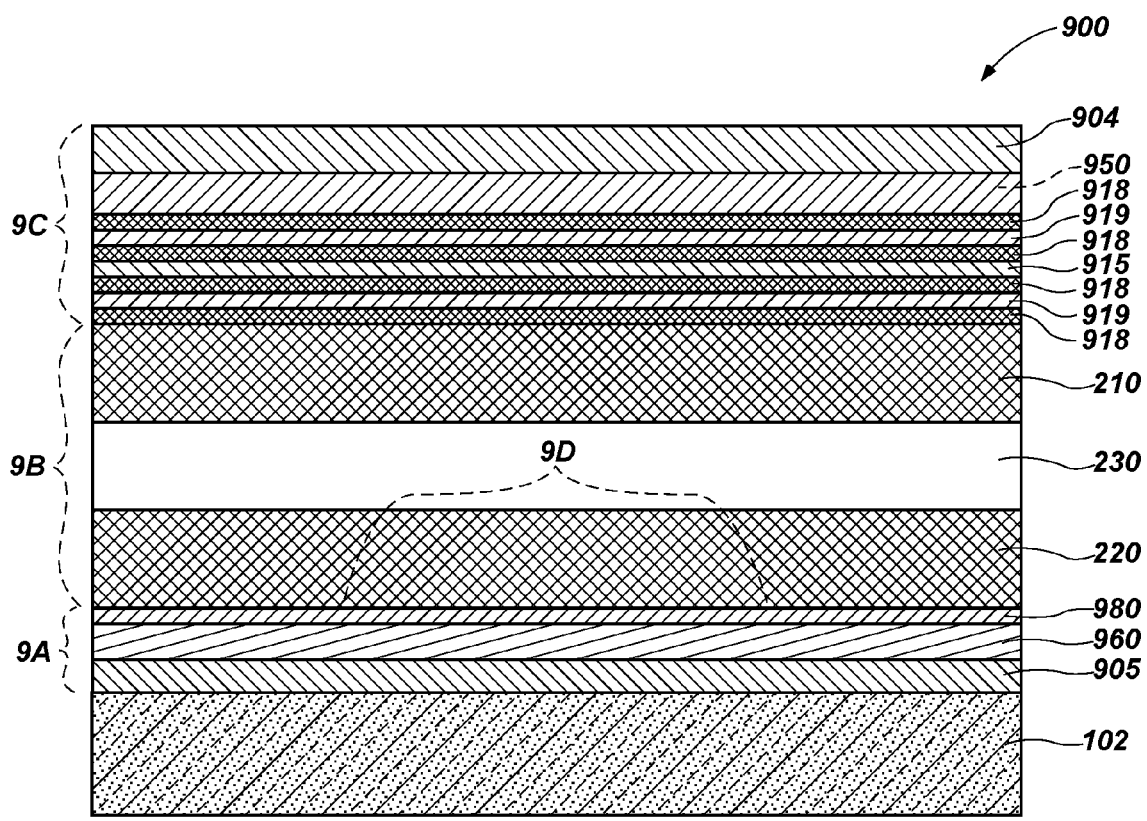
FIG. 9 is a cross-sectional, elevational, schematic illustration of a stage of processing to fabricate the magnetic cell structure of FIG. 1, according to an embodiment of the present disclosure.

With reference to FIG. 9, illustrated is a stage in a method of fabricating one or more magnetic cell structures (e.g., the magnetic cell structure 300 of FIG. 3). A precursor structure 900, comprising a sequence of materials, may be formed, in order, one material after the other, from the substrate 102 to an upper-most material. Accordingly, though the precursor structure 900 of FIG. 9 illustrates a sequence of materials that corresponds to that for forming the magnetic cell structure 300 of FIG. 3, it should be recognized that the order of materials may be appropriately adjusted to correspond to that of any of the other magnetic cell structures 400 through 800 (FIGS. 4 through 8, respectively), disclosed herein.

Though the materials of the precursor structure 900 may be formed in sequence, more than one formation technique may be utilized during formation of the precursor structure 900. Accordingly, while one or more materials may be formed by, e.g., sputtering, one or more other materials may be formed by other techniques, such as, and without limitation, laser ablation, ALD, or CVD. The formation technique may be selected in light of the material to be formed.

A conductive material 905 may be formed over the substrate 102. The conductive material 905, from which the lower electrode 105 (FIGS. 3 through 8) is to be formed, may comprise, consist essentially of, or consist of, for example and without limitation, a metal (e.g., copper, tungsten, titanium, tantalum), a metal alloy, or a combination thereof.

In embodiments in which the optional lower intermediary region 140 (FIGS. 4, 5, 6, and 8) may, optionally, be formed over the lower electrode 105, one or more lower intermediary materials (not illustrated in FIG. 9) may be formed over the conductive material 905. The lower intermediary materials, from which the lower intermediary region 140 is formed, may comprise, consist essentially of, or consist of, for example and without limitation, tantalum (Ta), titanium (Ti), tantalum nitride (TaN), titanium nitride (TiN), ruthenium (Ru), tungsten (W), or a combination thereof. In some embodiments, the lower intermediary material, if included, may be incorporated with the conductive material 905 from which the lower electrode 105 (FIGS. 3 through 8) is to be formed. For example, the lower intermediary material may be an upper-most sub-region of the conductive material 905.

In embodiments to form the magnetic cell structures 300, 700 of FIGS. 3 and 7, respectively, the foundation material described above (e.g., a foundation material 960) may be formed over the conductive material 905 and the lower intermediary materials, if present. The foundation material 960 may be amorphous and may comprise, consist essentially of, or consist of an amorphous conductive material, e.g., a metallic glass. The foundation material 960 may be formulated and configured to provide an amorphous surface that enables forming a seed material 980 thereover at a desired crystal structure (e.g., a hexagonal crystal structure, e.g., a hexagonal (0001) crystal structure). The seed material 980 may comprise, consist essentially of, or consist of any of the above-described seed materials (e.g., h-Zn (0001)).

In some embodiments, the seed material 980 may exhibit the desired crystal structure when initially formed on an underlying material. In other embodiments, the seed material 980 may be formed from a precursor seed material that does not exhibit the desired crystal structure when initially formed. For example, the precursor seed material may be annealed at a temperature within about 10% below the melting temperature of the precursor seed material, and the anneal may enable atoms of the precursor seed material to align in the desired crystal or polycrystalline structure having a desired crystal space group and orientation and to minimize overall system energy. Therefore, the seed material 980, exhibiting the desired crystal structure (or desired polycrystalline structure) is formed from the precursor seed material. In embodiments in which the seed material 980 comprises, consists essentially of, or consists of h-Zn, the precursor seed material may comprise, consist essentially of, or consist of zinc (Zn), which has a melting temperature of about 419.5° C. Therefore, the Zn-based precursor seed material may be annealed at a temperature between about 377.5° C. and about 419.5° C. to form the h-Zn exhibiting a desired hexagonal crystal structure and having the (0001) crystal plane as the crystal plane with the lowest surface energy.

The another magnetic material 220, from which the free region 120 (FIG. 1) is to be formed, may be formed over the seed material 980, and may be formulated and configured to template on the desired crystal structure of the seed material 980. In embodiments in which the seed material 980 exhibits the desired crystal structure as a result of an anneal, the another magnetic material 220 may be formed over the seed material 980 after the seed material 980 has been annealed to exhibit the desired crystal structure. In other embodiments, the another magnetic material 220 may be formed over the precursor seed material prior to annealing the precursor seed material, and the desired crystal structure, effected during the anneal of a precursor seed material, may propagate to the another magnetic material 220.

The nonmagnetic material 230, from which the tunnel barrier region 130 (FIG. 1) is to be formed, may be formed over the another magnetic material 220 and may be formulated and configured to template on the desired crystal structure of the another magnetic material 220. The magnetic material 210, from which the fixed region 110 (FIG. 1) is to be formed, may be formed over the nonmagnetic material 230 and may be formulated and configured to template on the desired crystal structure of the nonmagnetic material 230. The magnetic material 210 may be the same as or a different material than the another magnetic material 220. Either or both of the magnetic material 210 and the another magnetic material 220 may be formed homogeneously or, optionally, may be formed to include sub-regions of different materials.

The materials of the reference region 117 (FIG. 3) may then be formed over the above-described structure. For example, magnetic material 918 and conductive material 919 may be formed in an alternating structure with a coupler material 915 disposed between an upper alternating structure and a lower alternating structure of the magnetic material 918 and the conductive material 919. For example, and without limitation, the magnetic material 918 may comprise, consist essentially of, or consist of cobalt (Co); the conductive material 919 may comprise, consist essentially of, or consist of platinum (Pt); and the coupler material 915 may comprise, consist essentially of, or consist of ruthenium (Ru). In other embodiments, the materials of the reference region 117 (FIG. 3) may comprise, consist essentially of, or consist of cobalt/palladium (Co/Pd) multi-sub-regions; cobalt/platinum (Co/Pt) multi-sub-regions; cobalt/nickel (Co/Ni) multi-sub-regions; cobalt/iridium (Co/Ir) multi-sub-regions; cobalt iron terbium (Co/Fe/Tb) based materials, $L_1 0$ materials, coupler materials, or other magnetic materials of conventional fixed regions.

In some embodiments, optionally, one or more upper intermediary materials 950 may be formed over the materials for the reference region 117 (FIG. 3). The upper intermediary materials 950, which, if included, form the optional upper intermediary regions 150 (FIG. 3), may comprise, consist essentially of, or consist of materials configured to ensure a desired crystal structure in neighboring materials. The upper intermediary materials 950 may alternatively or additionally include metal materials configured to aid in patterning processes during fabrication of the magnetic cell, barrier materials, or other materials of conventional STT-MRAM cell core structures. In some embodiments, the upper intermediary material 950 may include a conductive material (e.g., one or more materials such as copper, tantalum, titanium, tungsten, ruthenium, tantalum nitride, or titanium nitride) to be formed into a conductive capping region.

Another conductive material 904, from which the upper electrode 104 (FIG. 3) may be formed, may be formed over the materials for the reference region 117 (FIG. 3) and, if present, the upper intermediary materials 950. In some embodiments, the another conductive material 904 and the upper intermediary materials 950, if present, may be integrated with one another, e.g., with the upper intermediary materials 950 being lower sub-regions of the conductive material 904.

Some or all of the materials of the precursor structure 900 may be annealed, in one or more annealing stages, e.g., to promote crystallization of materials. For example, in some embodiments, the materials of lower segment 9A of FIG. 9 may be formed and annealed to enable or improve the crystal structure of the seed material 980 into the desired crystal structure. Thereafter, the materials of middle segment 9B of FIG. 9, i.e., the materials of the MTJ 100 (FIG. 1), may be formed, in sequence, over the seed material 980. In some embodiments, forming the materials of the middle segment 9B may enable the materials to exhibit the desired crystal structure by templating on the seed material 980. Subsequent annealing of both the lower segment 9A with the middle segment 9B may improve the crystal structure in the materials of the MTJ 100 as well as improve the alignment of the lattice microstructures in the MTJ 100.

In embodiments in which the materials of the MTJ 100, formed over the seed material 980, do not initially template on the desired crystal structure exhibited by the seed material 980, subjecting the lower segment 9A and the middle segment 9B to an anneal may propagate the desired crystal structure from the seed material 980 to the materials of the MTJ 100 by solid phase epitaxy.

The materials of upper segment 9C may then be formed over the middle segment 9B and, optionally, subjected to another anneal.

Though three anneal stages are described with respect to the formation of the precursor structure of FIG. 9, it is contemplated that fewer anneals or additional anneals may, alternatively, be utilized.

Because the seed material 980 may be subjected to one or more anneals, the seed material 980 may be formulated or otherwise selected to have a melting temperature that is higher than the anneal temperature to be used. For example, the seed material 980 may be h-Zn with a melting temperature of approximately 420° C., and the anneal temperatures subsequently used may be lower than about 400° C., e.g., about 250° C.

Because, at least in some embodiments, the materials of the MTJ 100 (e.g., the magnetic material 210, the another magnetic material 220, and the nonmagnetic material 230) may not be formulated to include additives that are to out-diffuse during anneal, the degradation of characteristics (e.g., in magnetic anisotropy ("MA") strength) caused by out-diffusion of such additives in conventional magnetic cell structures may be avoided.

The seed material 980 is formed to at least cover region 9D of FIG. 9. Region 9D is the region to be occupied by a magnetic cell core structure (e.g., the magnetic cell core structure 300 of FIG. 3). In some embodiments, such as that of FIG. 9, the seed material 980 may cover the entirety of an upper surface of its neighboring, underlying material (e.g., the foundation material 960). In other embodiments, the seed material 980 may be formed to cover substantially only region 9D. In any case, the seed material 980 exhibits the desired crystal structure, and the overlying materials of the MTJ 100 may be formed to template from the desired crystal structure.

In embodiments in which the seed material 980 extends over more than just region 9D, the seed material 980 is monocrystalline, exhibiting the desired crystal structure, in region 9D. In some embodiments, the seed material 980 may be monocrystalline across its entire width. In other embodiments, the seed material 980 exhibit a different crystal structure (e.g., a polycrystalline structure) in regions adjacent to the region 9D. In any case, the seed material 980 exhibits the desired crystal structure (e.g., a hexagonal crystal structure) in the region 9D where the magnetic cell core (e.g., the magnetic cell core 301 of FIG. 3) is to be formed. The exhibition of other crystal structures, by the seed material 980, in regions substantially external to region 9D may not be detrimental, provided the adjacent material of the MTJ 100 (FIG. 1) may be formed to exhibit, throughout its width in region 9D, a matching crystal structure to the desired crystal structure of the seed material 980, whether by templating (i.e., epitaxial crystal growth) or by propagation (i.e., solid phase epitaxy), and also provided that the other materials of the MTJ 100 (FIG. 1) may be formed to, likewise, exhibit matching crystal structures, in the aligned lattice microstructure, throughout the width of region 9D.

The precursor structure 900 may be patterned, in one or more stages, to form the magnetic cell structure (e.g., the magnetic cell structure 300 of FIG. 3). Techniques for patterning structures such as the precursor structure 900 to form structures such as the magnetic cell structure 300 (FIG. 3) are known in the art and so are not described herein in detail.

Accordingly, disclosed is a method of forming a memory cell. The method comprises forming a seed material over a substrate. The seed material exhibits a hexagonal crystal structure. Materials of a magnetic tunnel junction are formed proximate to the seed material to effect, by at least one of epitaxial crystal growth or solid phase epitaxy, the hexagonal crystal structure in the materials. Forming the materials of the magnetic tunnel junction comprises forming a magnetic material, forming a nonmagnetic material on the magnetic material, and forming another magnetic material on the nonmagnetic material.

Also disclosed is a method of forming a memory cell, comprising forming a precursor structure over a substrate. Forming the precursor structure comprises forming an amorphous material over the substrate, forming a seed material over the amorphous material, forming a magnetic material on the seed material, forming a nonmagnetic material over the magnetic material, and forming another magnetic material over the nonmagnetic material. The seed material exhibits a hexagonal crystal structure. The precursor structure is patterned to form a magnetic cell core.

Figure 10:
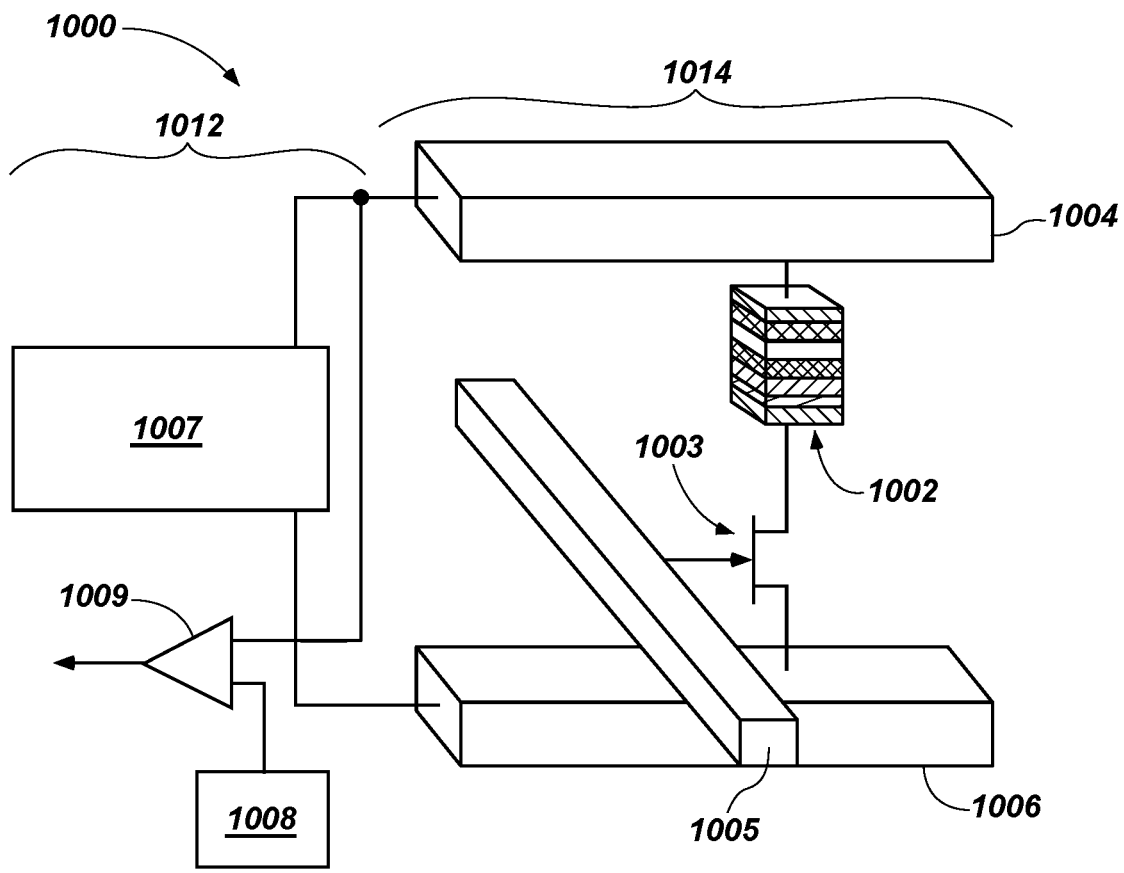
FIG. 10 is a schematic diagram of an STT-MRAM system including a memory cell having a magnetic cell structure according to an embodiment of the present disclosure.

With reference to FIG. 10, illustrated is an STT-MRAM system 1000 that includes peripheral devices 1012 in operable communication with an STT-MRAM cell 1014, a grouping of which may be fabricated to form an array of memory cells in a grid pattern including a number of rows and columns, or in various other arrangements, depending on the system requirements and fabrication technology. The STT-MRAM cell 1014 includes a magnetic cell core 1002, an access transistor 1003, a conductive material that may function as a data/sense line 1004 (e.g., a bit line), a conductive material that may function as an access line 1005 (e.g., a word line), and a conductive material that may function as a source line 1006. The peripheral devices 1012 of the STT-MRAM system 1000 may include read/write circuitry 1007, a bit line reference 1008, and a sense amplifier 1009. The cell core 1002 may be any one of the magnetic cell cores (e.g., the magnetic cell cores 301 through 801 (FIGS. 3 through 8) described above. Due to the structure of the cell core 1002, the method of fabrication, or both, the STT-MRAM cell 1014 may have a high TMR.

In use and operation, when the STT-MRAM cell 1014 is selected to be programmed, a programming current is applied to the STT-MRAM cell 1014, and the current is spin-polarized by the fixed region 110 (FIG. 1) of the cell core 1002 and exerts a torque on the free region 120 (FIG. 1) of the cell core 1002, which switches the magnetization of the free region 120 to "write to" or "program" the STT-MRAM cell 1014. In a read operation of the STT-MRAM cell 1014, a current is used to detect the resistance state of the cell core 1002.

To initiate programming of the STT-MRAM cell 1014, the read/write circuitry 1007 may generate a write current (i.e., a programming current) to the data/sense line 1004 and the source line 1006. The polarity of the voltage between the data/sense line 1004 and the source line 1006 determines the switch in magnetic orientation of the free region 120 (FIG. 1) in the cell core 1002. By changing the magnetic orientation of the free region 120 with the spin polarity, the free region 120 is magnetized according to the spin polarity of the programming current, the programmed logic state is written to the STT-MRAM cell 1014.

To read the STT-MRAM cell 1014, the read/write circuitry 1007 generates a read voltage to the data/sense line 1004 and the source line 1006 through the cell core 1002 and the access transistor 1003. The programmed state of the STT-MRAM cell 1014 relates to the electrical resistance across the cell core 1002, which may be determined by the voltage difference between the data/sense line 1004 and the source line 1006. In some embodiments, the voltage difference may be compared to the bit line reference 1008 and amplified by the sense amplifier 1009.

FIG. 10 illustrates one example of an operable STT-MRAM system 1000. It is contemplated, however, that the magnetic cell cores 301 through 801 (FIGS. 3 through 8) may be incorporated and utilized within any STT-MRAM system configured to incorporate a magnetic cell core having magnetic regions.

Accordingly, disclosed is a semiconductor device comprising a spin torque transfer magnetic random memory (STT-MRAM) array comprising STT-MRAM cells. At least one STT-MRAM cell of the STT-MRAM cells comprises a magnetic tunnel junction comprising a free region, a tunnel barrier region, and a fixed region. The free region comprises hexagonal cobalt, the tunnel barrier region comprises hexagonal boron nitride, and the fixed region comprises hexagonal cobalt. A conductive seed region is adjacent the magnetic tunnel junction. The conductive seed region comprises a hexagonal crystal structure.

Figure 11:
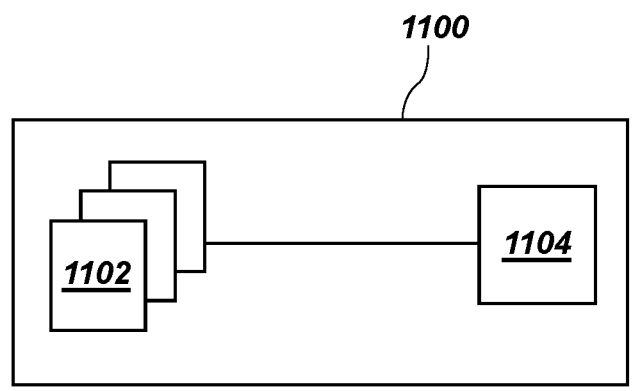
FIG. 11 is a simplified block diagram of a semiconductor device structure including memory cells having a magnetic cell structure according to an embodiment of the present disclosure.

With reference to FIG. 11, illustrated is a simplified block diagram of a semiconductor device 1100 implemented according to one or more embodiments described herein. The semiconductor device 1100 includes a memory array 1102 and a control logic component 1104. The memory array 1102 may include a plurality of the STT-MRAM cells 1014 (FIG. 10) including any of the magnetic cell cores 301 through 801 (FIGS. 3 through 8) discussed above, which magnetic cell cores 301 through 801 (FIGS. 3 through 8) may have been formed according to a method described above and may be operated according to a method described above. The control logic component 1104 may be configured to operatively interact with the memory array 1102 so as to read from or write to any or all memory cells (e.g., STT-MRAM cell 1014 (FIG. 10)) within the memory array 1102.

Figure 12:
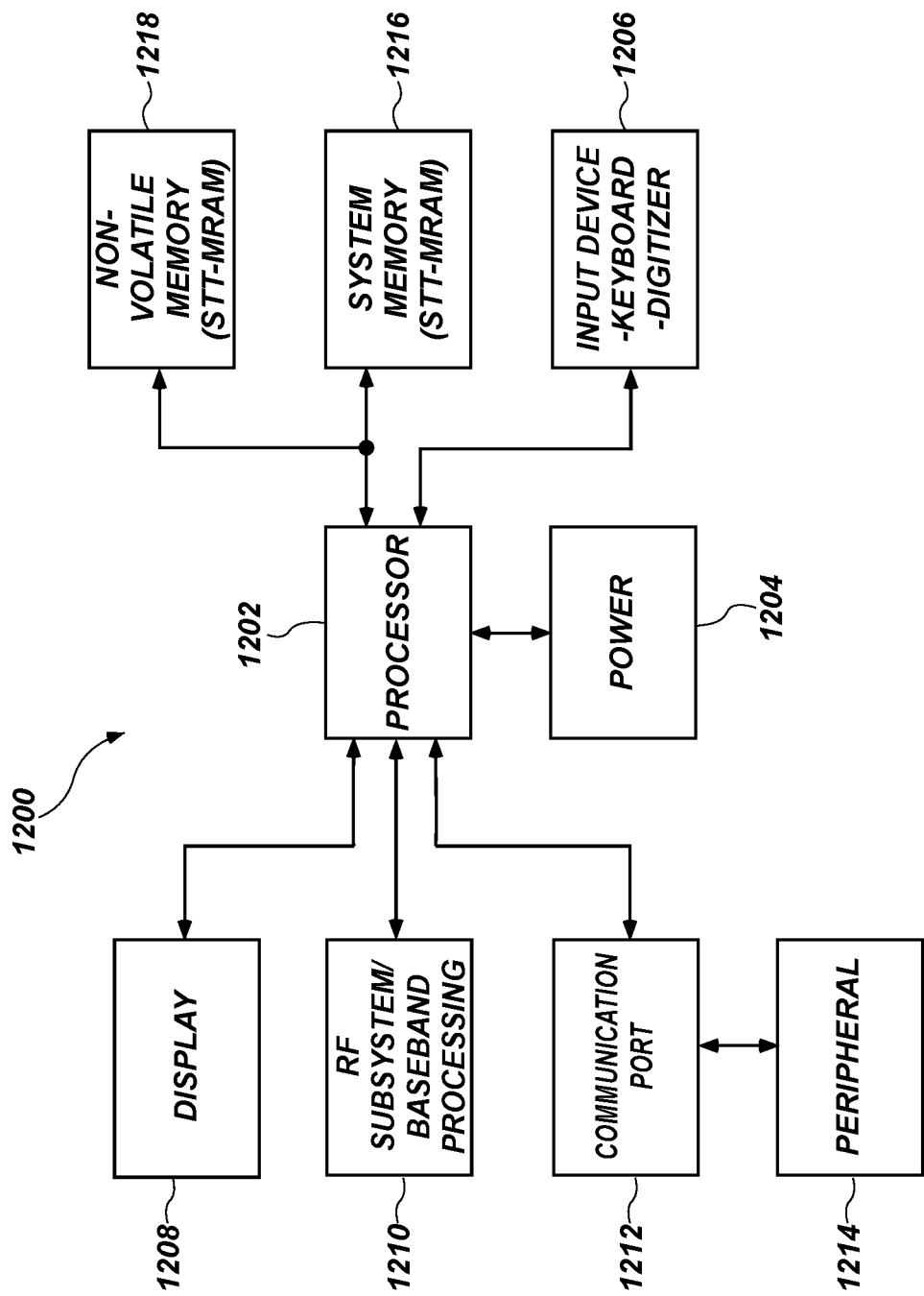
FIG. 12 is a simplified block diagram of a system implemented according to one or more embodiments of the present disclosure.

With reference to FIG. 12, depicted is a processor-based system 1200. The processor-based system 1200 may include various electronic devices manufactured in accordance with embodiments of the present disclosure. The processor-based system 1200 may be any of a variety of types such as a computer, pager, cellular phone, personal organizer, control circuit, or other electronic device. The processor-based system 1200 may include one or more processors 1202, such as a microprocessor, to control the processing of system functions and requests in the processor-based system 1200. The processor 1202 and other subcomponents of the processor-based system 1200 may include magnetic memory devices manufactured in accordance with embodiments of the present disclosure.

The processor-based system 1200 may include a power supply 1204 in operable communication with the processor 1202. For example, if the processor-based system 1200 is a portable system, the power supply 1204 may include one or more of a fuel cell, a power scavenging device, permanent batteries, replaceable batteries, and rechargeable batteries. The power supply 1204 may also include an AC adapter; therefore, the processor-based system 1200 may be plugged into a wall outlet, for example. The power supply 1204 may also include a DC adapter such that the processor-based system 1200 may be plugged into a vehicle cigarette lighter or a vehicle power port, for example.

Various other devices may be coupled to the processor 1202 depending on the functions that the processor-based system 1200 performs. For example, a user interface 1206 may be coupled to the processor 1202. The user interface 1206 may include input devices such as buttons, switches, a keyboard, a light pen, a mouse, a digitizer and stylus, a touch screen, a voice recognition system, a microphone, or a combination thereof. A display 1208 may also be coupled to the processor 1202. The display 1208 may include an LCD display, an SED display, a CRT display, a DLP display, a plasma display, an OLED display, an LED display, a three-dimensional projection, an audio display, or a combination thereof. Furthermore, an RF sub-system/baseband processor 1210 may also be coupled to the processor 1202. The RF sub-system/baseband processor 1210 may include an antenna that is coupled to an RF receiver and to an RF transmitter (not shown). A communication port 1212, or more than one communication port 1212, may also be coupled to the processor 1202. The communication port 1212 may be adapted to be coupled to one or more peripheral devices 1214, such as a modem, a printer, a computer, a scanner, or a camera, or to a network, such as a local area network, remote area network, intranet, or the Internet, for example.

The processor 1202 may control the processor-based system 1200 by implementing software programs stored in the memory. The software programs may include an operating system, database software, drafting software, word processing software, media editing software, or media playing software, for example. The memory is operably coupled to the processor 1202 to store and facilitate execution of various programs. For example, the processor 1202 may be coupled to system memory 1216, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1216 may include volatile memory, non-volatile memory, or a combination thereof. The system memory 1216 is typically large so that it can store dynamically loaded applications and data. In some embodiments, the system memory 1216 may include semiconductor devices, such as the semiconductor device 1100 of FIG. 11, memory cells including any of the magnetic cell cores 301 through 801 (FIGS. 3 through 8) described above, or a combination thereof.

The processor 1202 may also be coupled to non-volatile memory 1218, which is not to suggest that system memory 1216 is necessarily volatile. The non-volatile memory 1218 may include one or more of STT-MRAM, MRAM, read-only memory (ROM) such as an EPROM, resistive read-only memory (RROM), and flash memory to be used in conjunction with the system memory 1216. The size of the non-volatile memory 1218 is typically selected to be just large enough to store any necessary operating system, application programs, and fixed data. Additionally, the non-volatile memory 1218 may include a high capacity memory such as disk drive memory, such as a hybrid-drive including resistive memory or other types of non-volatile solid-state memory, for example. The non-volatile memory 1218 may include semiconductor devices, such as the semiconductor device 1100 of FIG. 11, memory cells including any of the magnetic cell cores 301 through 801 (FIGS. 3 through 8) described above, or a combination thereof.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A magnetic memory cell, comprising:
a seed region over a substrate, the seed region exhibiting a hexagonal crystal structure; and
a magnetic tunnel junction structure proximate the seed region, the magnetic tunnel junction structure comprising:
at least one magnetic region exhibiting a hexagonal crystal structure matching the hexagonal crystal structure of the seed region; and
a tunnel barrier region adjacent the at least one magnetic region and exhibiting another hexagonal crystal structure.

2. The magnetic memory cell of claim 1, wherein the hexagonal crystal structure of the at least one magnetic region and the another hexagonal crystal structure of the tunnel barrier region are both hexagonal (0001) crystal structures.

3. The magnetic memory cell of claim 1, wherein the hexagonal crystal structure of the at least one magnetic region is a close-packed crystal structure, and the another hexagonal crystal structure of the tunnel barrier region is not a close-packed crystal structure.

4. The magnetic memory cell of claim 1, wherein the magnetic tunnel junction structure overlies the seed region.

5. The magnetic memory cell of claim 1, wherein the seed region overlies the magnetic tunnel junction structure.

6. The magnetic memory cell of claim 5, further comprising a reference region overlying the seed region.

7. The magnetic memory cell of claim 1, further comprising another seed region exhibiting the hexagonal crystal structure, wherein the magnetic tunnel junction structure is between the seed region and the another seed region.

8. A magnetic memory cell, comprising:
a magnetic cell core comprising:
a magnetic tunnel junction structure comprising a tunnel barrier region between a free region and a fixed region, the tunnel barrier region comprising a nonmagnetic material exhibiting a hexagonal crystal structure matching a hexagonal crystal structure of a directly adjacent material; and
a seed region adjacent the magnetic tunnel junction structure, the seed region comprising a seed material exhibiting another hexagonal crystal structure.

9. The magnetic memory cell of claim 8, wherein the nonmagnetic material comprises hexagonal boron nitride (h-BN).

10. The magnetic memory cell of claim 8, wherein the seed material comprises hexagonal zinc (h-Zn).

11. The magnetic memory cell of claim 8, wherein the seed material comprises hexagonal ruthenium (h-Ru).

12. The magnetic memory cell of claim 8, wherein at least one of the free region or the fixed region comprises hexagonal cobalt (h-Co).

13. The magnetic memory cell of claim 8, wherein:
the fixed region overlies the free region; and
the seed region underlies the magnetic tunnel junction structure,
the free region comprising a magnetic material exhibiting a hexagonal crystal structure matching the another hexagonal crystal structure of the seed material of the seed region.

14. The magnetic memory cell of claim 13, further comprising another seed region overlying the magnetic tunnel junction structure and exhibiting the another hexagonal crystal structure.

15. The magnetic memory cell of claim 8, wherein:

the free region overlies the fixed region; and the seed region underlies the magnetic tunnel junction structure, the fixed region comprising a magnetic material exhibiting a hexagonal crystal structure matching the another hexagonal crystal structure of the seed material of the seed region.

16. The magnetic memory cell of claim 15, further comprising another seed region overlying the magnetic tunnel junction structure and exhibiting the another hexagonal crystal structure.

17. A method of forming a magnetic memory cell, comprising:

forming a precursor structure comprising:

forming a seed material over a substrate, the seed material exhibiting a hexagonal crystal structure;

forming a magnetic material adjacent the seed material;

forming a nonmagnetic material adjacent the magnetic material, the nonmagnetic material exhibiting another hexagonal crystal structure matching a hexagonal crystal structure exhibited by a directly adjacent material; and forming another magnetic material adjacent the nonmagnetic material; and patterning the precursor structure to form a magnetic cell core of the magnetic memory cell.

18. The method of claim 17, wherein:

forming a seed material over a substrate comprises forming the seed material over an amorphous foundation material and over the substrate; and forming a magnetic material adjacent the seed material comprises forming the magnetic material over the seed material.

19. The method of claim 17, wherein:

forming the another magnetic material precedes forming the nonmagnetic material;

forming the nonmagnetic material precedes forming the magnetic material; and forming the magnetic material precedes forming the seed material, the precursor structure comprising the seed material overlying the magnetic material, the nonmagnetic material, the another magnetic material, and the substrate.

20. The method of claim 19, wherein:

forming the magnetic material comprises forming an amorphous magnetic material over the nonmagnetic material;

forming the seed material comprises forming the seed material on the amorphous magnetic material; and annealing at least the seed material and the amorphous magnetic material to propagate the hexagonal crystal structure from the seed material to the amorphous magnetic material to convert the amorphous magnetic material into the magnetic material, the magnetic material exhibiting a hexagonal crystal structure matching the hexagonal crystal structure of the seed material.

* * * * *